United States Patent
Lee et al.

(10) Patent No.: US 9,019,769 B2
(45) Date of Patent: Apr. 28, 2015

(54) SEMICONDUCTOR DEVICE AND MANUFACTURING METHOD AND OPERATING METHOD FOR THE SAME

(71) Applicant: Macronix International Co., Ltd., Hsinchu (TW)

(72) Inventors: Feng-Ming Lee, Hsinchu (TW); Yu-Yu Lin, New Taipei (TW); Ming-Hsiu Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 188 days.

(21) Appl. No.: 13/710,517

(22) Filed: Dec. 11, 2012

(65) Prior Publication Data
US 2014/0160852 A1    Jun. 12, 2014

(51) Int. Cl.
*G11C 16/04* (2006.01)
*H01L 29/788* (2006.01)
*H01L 21/28* (2006.01)

(52) U.S. Cl.
CPC .......... *G11C 16/0408* (2013.01); *H01L 29/788* (2013.01); *H01L 21/28273* (2013.01)

(58) Field of Classification Search
USPC .............................. 365/185.18, 185.26, 185.27
See application file for complete search history.

(56) References Cited

U.S. PATENT DOCUMENTS

| 7,176,514 | B2* | 2/2007 | Hecht et al. | 257/310 |
| 7,817,472 | B2 | 10/2010 | Kuo et al. | |
| 7,868,410 | B2* | 1/2011 | Vereecken et al. | 257/499 |
| 7,875,883 | B2* | 1/2011 | Sakamoto et al. | 257/41 |
| 8,134,139 | B2* | 3/2012 | Lin et al. | 257/4 |
| 8,786,932 | B2* | 7/2014 | Copeland et al. | 359/269 |
| 2010/0097735 | A1* | 4/2010 | Nodin | 361/56 |

FOREIGN PATENT DOCUMENTS

TW    200935426 A    8/2009

OTHER PUBLICATIONS

TW Office Action dated Dec. 22, 2014.

* cited by examiner

*Primary Examiner* — Pho M Luu
(74) *Attorney, Agent, or Firm* — McClure, Qualey & Rodack, LLP

(57) ABSTRACT

A semiconductor device and a manufacturing method and an operating method for the same are provided. The semiconductor device comprises a substrate, a doped region and a stack structure. The doped region is in the substrate. The stack structure is on the substrate. The stack structure comprises a dielectric layer, an electrode layer, a solid electrolyte layer and an ion supplying layer.

19 Claims, 5 Drawing Sheets

SEMICONDUCTOR DEVICE AND MANUFACTURING METHOD AND OPERATING METHOD FOR THE SAME

BACKGROUND

1. Technical Field

The disclosure relates in general to a semiconductor device and a manufacturing method and an operating method for the same and more particularly to a semiconductor device having variable threshold voltages and a manufacturing method and an operating method for the same.

2. Description of the Related Art

Along with the advance in semiconductor technology, electronic elements are kept being miniaturized, such that electronic products possess more and more functions when the size remains unchanged or become even smaller. As there are more and more information to be processed, the demand for the memory having larger capacity but smaller size is ever increasing.

Currently, the read-write memory stores data by means of a transistor structure assisted by a memory cell. However, the technology for manufacturing such memory has come to a bottleneck in terms of scalability. Therefore, more advanced memory structures, such as phase change random access memory (PCRAM), magnetic random access memory (MRAM), and resistive random access memory (RRAM), conductive bridging RAM (CBRAM) and so on are presented.

However, currently, there is still need to improve an operating efficiency of a memory device.

SUMMARY

A semiconductor device is provided. The semiconductor device comprises a substrate, a doped region and a stack structure. The doped region is in the substrate. The stack structure is on the substrate. The stack structure comprises a dielectric layer, an electrode layer, a solid electrolyte layer and an ion supplying layer.

An operating method for a semiconductor device. The semiconductor device comprises a semiconductor substrate, a source, a drain, a dielectric layer, an electrode layer, a solid electrolyte layer, and an ion supplying layer. The dielectric layer is on the semiconductor substrate between the source and the drain. The electrode layer is on the dielectric layer. The solid electrolyte layer is on the electrode layer. The ion supplying layer is on the solid electrolyte layer. The method comprises following steps. A first bias voltage is applied to the ion supplying layer of the semiconductor device. A second bias voltage is applied to the ion supplying layer. A polarity of the first bias voltage is opposite to a polarity of the second bias voltage.

A method for manufacturing a semiconductor device is provided. The method comprises following steps. A doped region is formed in a substrate. A stack structure is formed on the substrate. The stack structure comprises a dielectric layer, an electrode layer, a solid electrolyte layer and an ion supplying layer.

The above and other aspects of the disclosure will become better understood with regard to the following detailed description of the non-limiting embodiment(s). The following description is made with reference to the accompanying drawings.

DETAILED DESCRIPTION

Figure 1:
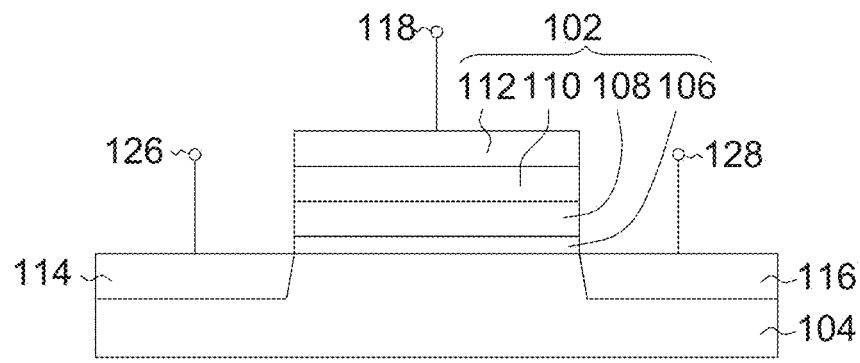
FIG. 1 illustrates a cross-section view of a semiconductor device according to one embodiment.

FIG. 1 illustrates a cross-section view of a semiconductor device according to one embodiment. Referring to FIG. 1, a stack structure 102 is formed on a semiconductor substrate 104. The stack structure 102 may comprise a dielectric layer 106, an electrode layer 108, a solid electrolyte layer 110 and an ion supplying layer 112 formed from bottom to top in sequence. In embodiments, the solid electrolyte layer 110 is physically contacted between the electrode layer 108 and the ion supplying layer 112. A source 114 and a drain 116 are formed in the semiconductor substrate 104 on opposing sides of the stack structure 102, respectively.

The semiconductor substrate 104 may comprise a silicon substrate, silicon on insulator (SOI), a semiconductor epitaxial layer or other suitable materials.

The dielectric layer 106 may comprise an oxide, a nitride, such as silicon oxide ($SiO_2$), silicon nitride, silicon oxynitride, a metal oxide, a high-k material or other suitable materials. The dielectric layer 106 may be a single layer film such as a single oxide layer, or multiple layers film such as an ONO structure, or other suitable structures. The dielectric layer 106 may be formed by a deposition method, a thermal oxidation method, etc.

The electrode layer 108 may comprise polysilicon or a metal, such as TiN, TaN, WN or other suitable materials. The electrode layer 108 may be a single layer film or a multiple layers film such as TiN/TaN/WN structure, or other suitable structures.

The solid electrolyte layer 110 may comprise a material that has low electrons conductivity and high ion conductivity. The solid electrolyte layer 110 may comprise an oxide, a nitride, such as silicon oxide ($SiO_2$), silicon nitride, silicon oxynitride, a metal oxide, a high-K material, or other suitable materials. The solid electrolyte layer 110 may comprise Hf-oxide, Zr-oxide, or Ta-oxide, etc. The solid electrolyte layer 110 may be a single layer film or a multiple layers film. The solid electrolyte layer 110 may be formed by a deposition method, a thermal oxidation method, etc.

The ion supplying layer 112 is used for applying ions able to move into the solid electrolyte layer 110. In embodiments, an ion solubility for the ion supplying layer 112 is larger than an ion solubility for the solid electrolyte layer 110. In some embodiments, the ion supplying layer 112 comprises a metal containing chalcogenide compound, such as a chalcogenide compound containing Cu, Ag, Zn, etc. The ion supplying layer 112 may comprise metal containing germanium antimony telluride (GST) of high electrical conductivity material, such as Cu-GST, Au-GST, Zn-GST, etc. The ions that the ion supplying layer 112 can apply comprise Cu ions, Ag ions, Zn ions, etc.

In one embodiment, the source 114 and the drain 116 may be formed after the dielectric layer 106 and the electrode layer 108 are formed. Next, other films of the stack structure 102, such as the solid electrolyte layer 110 and the ion supplying layer 112, may be formed on the electrode layer 108. In other embodiments, the source 114 and the drain 116 may be formed after the whole films of the stack structure 102 are formed. An annealing step may be performed at suitable timings such as after the whole films of the structure 102 are formed. The annealing step may use a 400° C. annealing temperature for 20 minutes.

The methods for manufacturing the semiconductor device according to embodiments are very simple. The area for the semiconductor device can be decreased due to the design of the stack structure. It can improve scaling development for the semiconductor device. For example, each of the films of the stack structure can be scaled down to a critical feature of 5 nm node. For example, coulomb blockade effect would not happen to electrical neutral atom storage in the solid electrolyte layer of 5 nm node. Therefore, the semiconductor device can have high operating efficiency.

In embodiments, the semiconductor device may be regarded a nonvolatile memory formed by integrating a transistor and an electrochemical (EC) device. In other words, a device structure formed by the semiconductor substrate 104, the dielectric layer 106, the electrode layer 108, the source 114 and the drain 116 may be regarded as the transistor. A device structure formed by the electrode layer 108, the solid electrolyte layer 110 and the ion supplying layer 112 may be regarded as the EC device.

In embodiments, the electrode layer 108 is functioned as a floating gate electrode. The ion supplying layer 112 is functioned as a control gate electrode. In other words, the ion supplying layer 112 is the only one of the stack structure 102 that is coupled to a control electrode terminal 118. The electrode layer 108 is floated. The semiconductor substrate 104, the dielectric layer 106 and the electrode layer 108 form a constant capacitance device structure. In embodiments, the electrode layer 108, the solid electrolyte layer 110 and the ion supplying layer 112 form a variable capacitance device structure.

For example, an operating method for the semiconductor device may comprise programming, reading and erasing the semiconductor device, etc.

Figure 2:
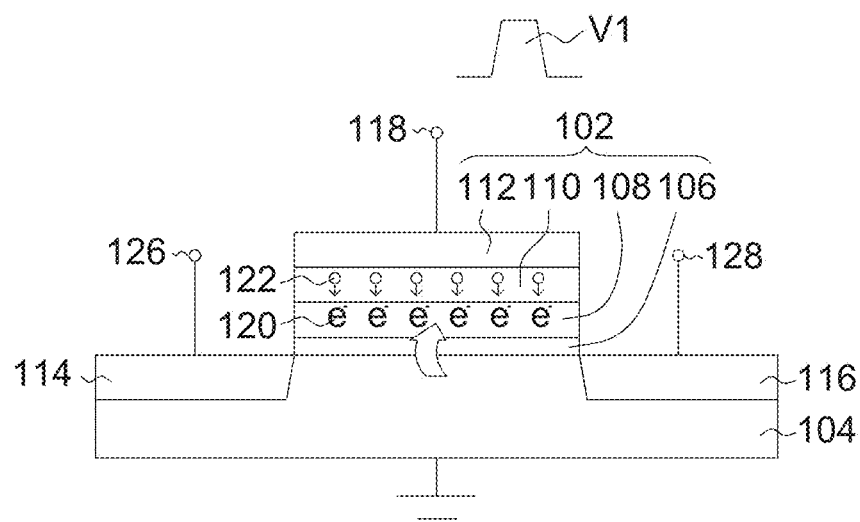
FIG. 2 is a schematic drawing showing a semiconductor device during an operating according to one embodiment.

Referring to FIG. 2, the semiconductor device may be programmed by a method comprising applying a first bias voltage V1 from the control electrode terminal 118 to the ion supplying layer 112 of the semiconductor device. For example, the first bias voltage V1 is a positive voltage such as a positive pulse, based on the semiconductor substrate 104 as a reference, e.g. the semiconductor substrate 104 being grounded.

Referring to FIG. 2, the step for applying the first bias voltage V1 induces a moving of charge carriers 120 from the semiconductor substrate 104 to tunnel through the dielectric layer 106 (i.e. tunneling layer) into the electrode layer 108 and transfer into the solid electrolyte layer 110. For example, the charge carriers 120 comprise electrons. At the same time, the step for applying the first bias voltage V1 induces a moving of ions 122 from the ion supplying layer 112 into the solid electrolyte layer 110. The ions 122 comprises metal ions such as Cu ions, Ag ions, or Zn ions, etc. that have positive charges.

Figure 3:
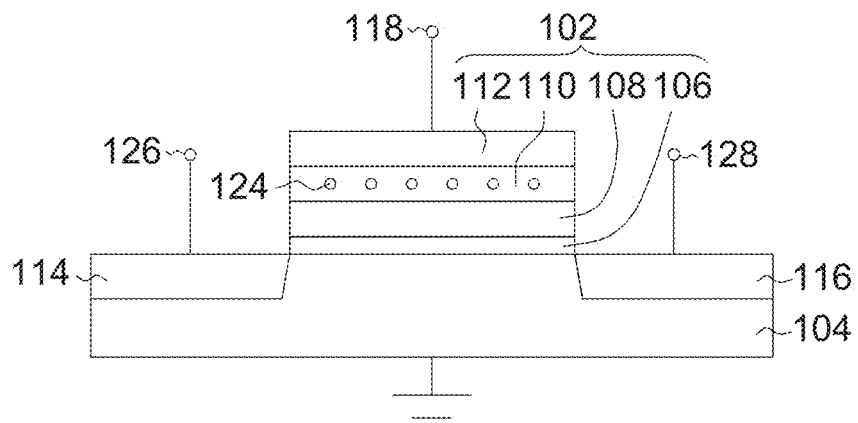
FIG. 3 is a schematic drawing showing a semiconductor device during an operating according to one embodiment.

Referring to FIG. 3, for example, the charge carriers 120 and the ions 122 moved into the solid electrolyte layer 110 by applying the first bias voltage V1 combine together to form a conductive medium 124 accumulated in the solid electrolyte layer 110 (i.e. storage layer). The conductive medium 124 (i.e. atom storage layer) may comprise electrical neutral metal atoms such as Cu atoms, Au atoms, or Zn atoms, etc.

The conductive medium 124 formed in the solid electrolyte layer 110 by applying the first bias voltage V1 results in an increase of electrical conductivity of the solid electrolyte layer 110, that is, results in a decrease of dielectric constant of the solid electrolyte layer 110. The step for applying the first bias voltage V1 to the ion supplying layer 112 results in the device structure has a first capacitance Cs1, wherein the device structure is formed by the electrode layer 108, the solid electrolyte layer 110 and the ion supplying layer 112. In addition, the step for applying the first bias voltage V1 to the ion supplying layer 112 results in the device structure has a capacitance Cd1, wherein the device structure is formed by the semiconductor substrate 104, the dielectric layer 106 and the electrode layer 108. Therefore, the semiconductor device has a first threshold voltage Vt1 from the first capacitance Cs1 and the capacitance Cd1 electrically connected in series.

In one embodiment, after the semiconductor device is programmed, the program state of the semiconductor device may be read. For example, the semiconductor device may be read by applying bias voltages from a source electrode terminal 126 and a drain electrode terminal 128 to the source 114 and the drain 116 respectively. For example, a bias voltage of an absolute value bigger than zero is applied to the source 114, and the drain 116 is grounded. Other bias voltage designs may be used for reading the semiconductor device.

Figure 4:
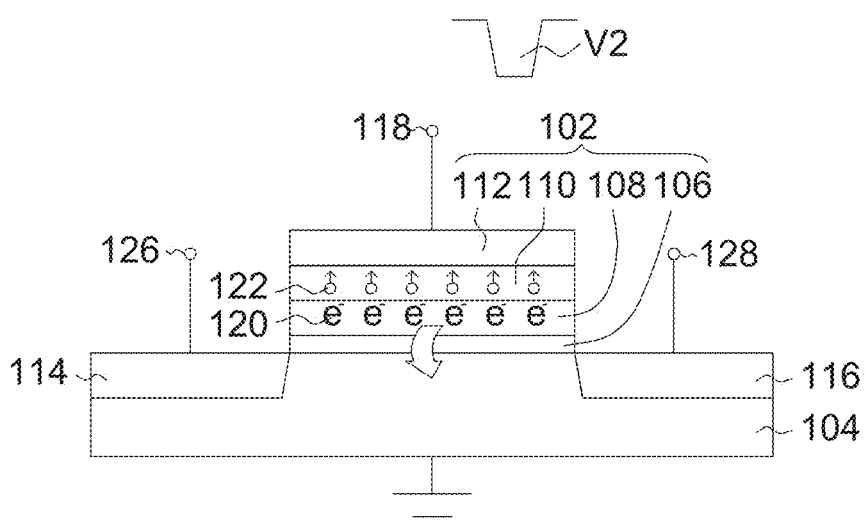
FIG. 4 is a schematic drawing showing a semiconductor device during an operating according to one embodiment.

Referring to FIG. 4, the semiconductor device may be erased by a method comprising applying a second bias voltage V2 from the control electrode terminal 118 to the ion supplying layer 112 of the stack structure 102. A polarity of the first bias voltage V1 for programming is opposite to a polarity of the second bias voltage V2 for erasing. For example, the second bias voltage V2 is a negative voltage such as a negative pulse, based on the semiconductor substrate 104 as a reference, e.g. the semiconductor substrate 104 being grounded. In embodiments, the erasing step may be after the programming step or reading program state step.

Referring to FIG. 4, the step for applying the second bias voltage V2 induces a decomposition of conductive medium 124 (FIG. 3) of the solid electrolyte layer 110 back into the charge carriers 120 and the ions 122 having opposing polarities. Moreover, the charge carriers 120 from the solid electrolyte layer 110 are transferred into the electrode layer 108 and tunneled through the dielectric layer 106 to the semiconductor substrate 104. For example, the charge carriers 120 comprise electrons. In addition, the ions 122 in the solid electrolyte layer 110 are drawn back into the ion supplying layer 112. The ions 122 comprise metal ions such as Cu ions, Ag ions, or Zn ions, etc that have positive charges. Therefore, the semiconductor device is turned backed to the state as shown in FIG. 1 by applying the second bias voltage V2 to the ion supplying layer 112.

The removing for the conductive medium 124 from the solid electrolyte layer 110 by applying the second bias voltage V2 results in an decrease of electrical conductivity of the solid electrolyte layer 110, that is, results in a increase of the dielectric constant of the solid electrolyte layer 110. The step for applying the second bias voltage V2 to the ion supplying layer 112 results in the device structure has a second capacitance Cs2, wherein the device structure is formed by the electrode layer 108, the solid electrolyte layer 110 and the ion supplying layer 112. In addition, the step for applying the second bias voltage V2 to the ion supplying layer 112 results in the device structure has a capacitance Cd2, wherein the device structure is formed by the semiconductor substrate 104, the dielectric layer 106 and the electrode layer 108.

Therefore, the semiconductor device has a second threshold voltage Vt2 Vt1 from the second capacitance Cs2 and the capacitance Cd2 electrically connected in series. The capacitance Cd2 resulted from the second bias voltage V2 is equal to the capacitance Cd1 resulted from the first bias voltage V1. The second capacitance Cs2 resulted from the second bias voltage V2 is different from the first bias voltage V1 resulted from the first bias voltage V1, that is, a coupling ratio of the semiconductor device resulted from the second bias voltage V2 is different from the a coupling ratio of the semiconductor device resulted from the first bias voltage V1. Therefore, the second threshold voltage Vt2 of the semiconductor device is different from the first threshold voltage Vt1 of the semiconductor device, thus the semiconductor device can be corresponded to various storage states. In embodiments, the first capacitance Cs1 is bigger than the second capacitance Cs2. In other words, the coupling ratio of the semiconductor device resulted from the first bias voltage is bigger than the coupling ratio of the semiconductor device resulted from the second bias voltage. In addition, the first threshold voltage Vt1 is smaller than the second threshold voltage Vt2.

In one embodiment, after the semiconductor device is erased, the erase state of the semiconductor device may be read. For example, the semiconductor device may be read by applying bias voltages from the source electrode terminal 126 and the drain electrode terminal 128 to the source 114 and the drain 116 respectively. For example, a bias voltage of an absolute value bigger than zero is applied to the source 114, and the drain 116 is grounded. Other bias voltage designs may be used for reading the semiconductor device.

The semiconductor device according to embodiments may be regarded as 1T memory. In some embodiments, two terminal RRAM devices may use the semiconductor device according to embodiments, replacing conventional charge storage devices of 1D1R or 1T1R devices and without additional driving devices. The program/erase current is very low, limited by tunneling current. Therefore, it is possible to design arrays having high unit density. Moreover, the device can have low power consumption.

Figure 5:
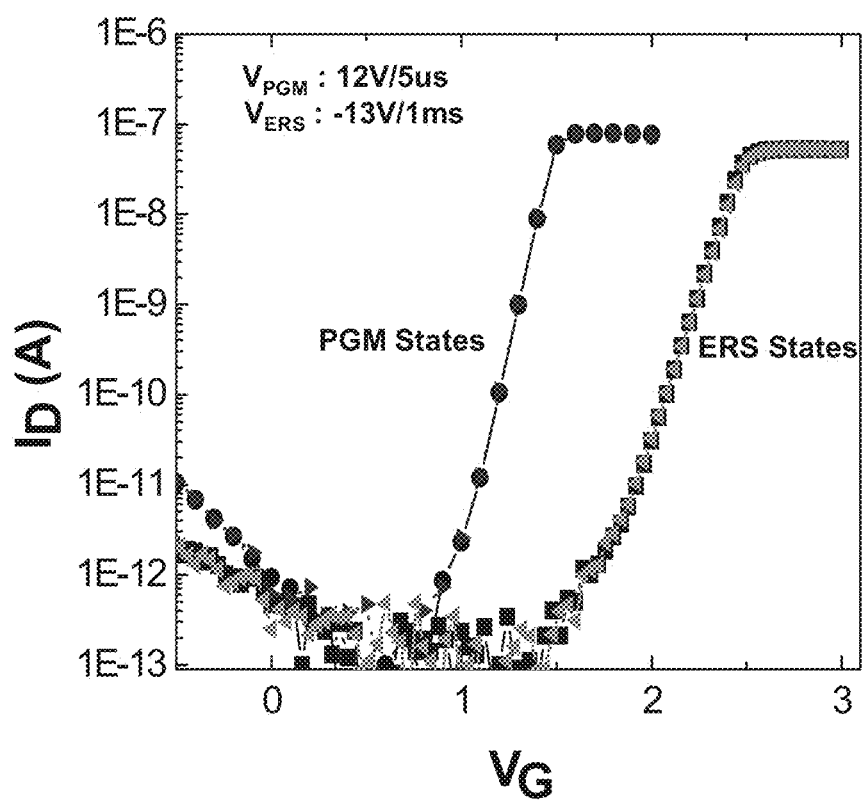
FIG. 5 shows curves of electric characteristics of a semiconductor device according to one embodiment.

In one embodiment, the electric characteristics of the semiconductor device in the program state and the erase sate are shown as curves in FIG. 5. The pulse for programming is 12V/5 us, and the pulse for erasing is −13V/1 ms.

It is obtained that the threshold voltage resulted from the programming pulse is 1.4V @ 10 nA. In addition, the threshold voltage resulted from the erasing pulse is 2.4V @ 10 nA. In this case, the difference between threshold voltages in program state and erase state is about 1V.

Figure 6:
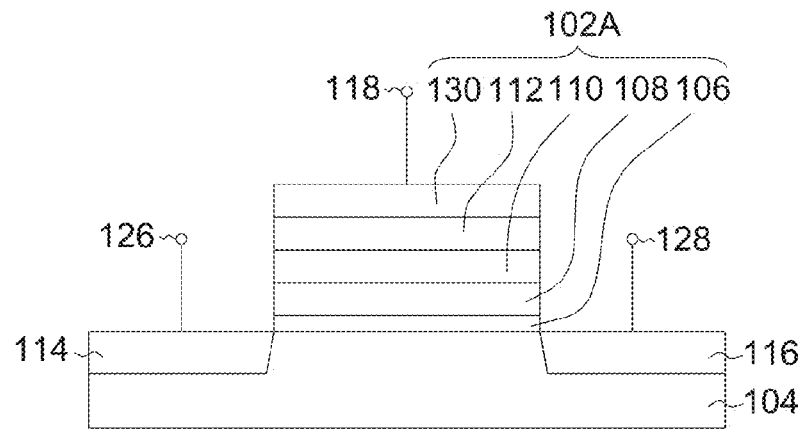
FIG. 6 illustrates a cross-section view of a semiconductor device according to one embodiment.

The semiconductor device in FIG. 6 is different from the semiconductor device in FIG. 1 in that the stack structure 102A comprises a conductive layer 130 on the ion supplying layer 112. The ion supplying layer 112 is coupled to the control electrode terminal 118 through the conductive layer 130. The conductive layer 130 may be used as a barrier layer for preventing the ions in the ion supplying layer 112 from diffusing for improving the operating efficiency of the device. The conductive layer 130 may comprise polysilicon or a metal such as TiN, TaN, WN, etc., or other suitable materials. The conductive layer 130 may be a single layer film or a multiple layers film, such as TiN/TaN/WN structure, or other suitable structures.

Figure 7:
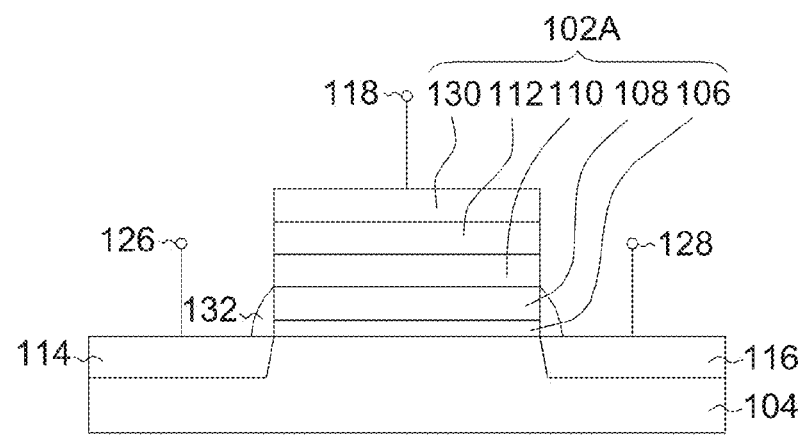
FIG. 7 illustrates a cross-section view of a semiconductor device according to one embodiment.

The semiconductor device in FIG. 7 is different from the semiconductor device in FIG. 6 in that a spacer 132 is formed on sidewalls of the dielectric layer 106 and the electrode layer 108 of the stack structure 102A. This concept can be applied for the semiconductor device as shown in FIG. 1. In one embodiment, the spacer 132 may be formed after the dielectric layer 106 and the electrode layer 108 are formed. Next, the source 114 and the drain 116 may be formed by doping the semiconductor substrate 104 by a doping step using the spacer 132 as a mask. Next, the other films of the stack structure 102A, such as the solid electrolyte layer 110, the ion supplying layer 112 and the conductive layer 130 may be formed on the electrode layer 108. In other embodiments, the spacer 132 may be formed after the whole films of the stack structure 102A are formed, and then the source 114 and the drain 116 may be formed. An annealing step may be performed at suitable timings such as after the whole films of the structure 102A are formed. The annealing step may use a 400° C. annealing temperature for 20 minutes.

Figure 8:
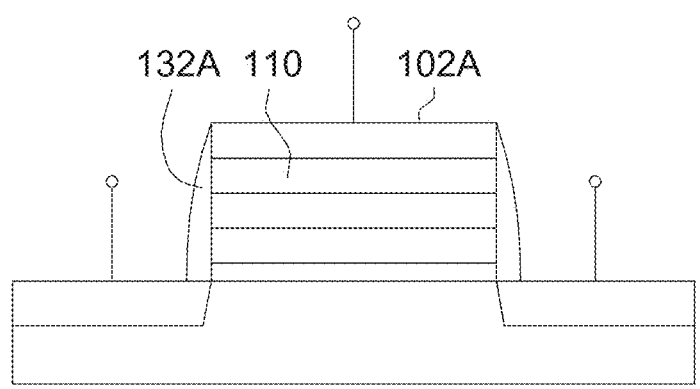
FIG. 8 illustrates a cross-section view of a semiconductor device according to one embodiment.

The semiconductor device in FIG. 8 is different from the semiconductor device in FIG. 7 in that the spacer 132A is formed on sidewalls of the whole films of the stack structure 102A. In embodiments, the spacer 132A on the sidewalls of the solid electrolyte layer 110 and the ion supplying layer 112 may be used as a barrier layer for preventing the ions in the solid electrolyte layer 110 and the ion supplying layer 112 from diffusing for improving the operating efficiency of the device. This design concept can be applied to the semiconductor device as shown in FIG. 1.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a substrate;
   a doped region in the substrate; and
   a stack structure on the substrate, the stack structure comprising:
   a dielectric layer;
   an electrode layer;
   a solid electrolyte layer; and
   an ion supplying layer, wherein the electrode layer and the substrate are separated by the dielectric layer.

2. The semiconductor device according to claim 1, wherein the solid electrolyte layer is between the electrode layer and the ion supplying layer.

3. The semiconductor device according to claim 1, wherein the electrode layer is functioned as a floating gate, the ion supplying layer is functioned as a control gate.

4. The semiconductor device according to claim 1, wherein the electrode layer, the solid electrolyte layer and the ion supplying layer form a variable capacitance device structure, the substrate, the dielectric layer and the electrode layer form a constant capacitance device structure.

5. An operating method for a semiconductor device, comprising:
   applying a first bias voltage to the ion supplying layer of the semiconductor device according to claim 1; and
   applying a second bias voltage to the ion supplying layer, wherein a polarity of the first bias voltage is opposite to a polarity of the second bias voltage.

6. The operating method for the semiconductor device according to claim 5, comprising:
   programming the semiconductor device, comprising applying the first bias voltage to the ion supplying layer; and
   erasing the semiconductor device, comprising applying the second bias voltage to the ion supplying layer.

7. The operating method for the semiconductor device according to claim 5, wherein the electrode layer of the semiconductor device is floated.

8. The operating method for the semiconductor device according to claim 5, wherein the step for applying the first bias voltage to the ion supplying layer results in the semiconductor device having a first threshold voltage, the step for applying the second bias voltage to the ion supplying layer results in the semiconductor device having a second threshold voltage different from the first threshold voltage.

9. The operating method for the semiconductor device according to claim 5, wherein the step for applying the first bias voltage to the ion supplying layer results in a device structure formed by the electrode layer, the solid electrolyte layer and the ion supplying layer having a first capacitance, the step for applying the second bias voltage to the ion supplying layer results in the device structure having a second capacitance different from the first capacitance.

10. The operating method for the semiconductor device according to claim 5, wherein the step for applying the first bias voltage induces a moving of charge carriers from the substrate to tunnel through the dielectric layer into the electrode layer and transfer into the solid electrolyte layer, and induces a moving of ions from the ion supplying layer into the solid electrolyte layer, the step for applying the second bias voltage induces a moving of the charge carriers from the solid electrolyte layer back into the substrate, and induces in a moving of the ions from the solid electrolyte layer back into the ion supplying layer.

11. The operating method for the semiconductor device according to claim 10, wherein the charge carriers and the ions moved into the solid electrolyte layer combine together to form a conductive medium in the solid electrolyte layer.

12. The operating method for the semiconductor device according to claim 5, wherein the step for applying the first bias voltage results in a conductive medium formed in the solid electrolyte layer.

13. The operating method for the semiconductor device according to claim 12, wherein the conductive medium comprising metal atoms.

14. The operating method for the semiconductor device according to claim 5, wherein the step for applying the second bias voltage is for removing a conductive medium from the solid electrolyte layer.

15. The operating method for the semiconductor device according to claim 5, wherein a device structure formed by the substrate, the dielectric layer and the electrode layer has a fixed capacitance during the step for applying the first bias voltage and the step for applying the second bias voltage.

16. A method for manufacturing a semiconductor device, comprising:
   providing a substrate;
   forming a doped region in the substrate; and
   forming a stack structure on the substrate, the stack structure comprising
   a dielectric layer;
   an electrode layer;
   a solid electrolyte layer; and
   an ion supplying layer on the solid electrolyte layer, wherein the electrode layer and the substrate are separated by the dielectric layer.

17. The method for manufacturing the semiconductor device according to claim 16, wherein the electrode layer, the solid electrolyte layer and the ion supplying layer form a variable capacitance device structure, the substrate, the dielectric layer and the electrode layer form a constant capacitance device structure.

18. The method for manufacturing the semiconductor device according to claim 16, wherein the solid electrolyte layer is between the electrode layer and the ion supplying layer.

19. The method for manufacturing the semiconductor device according to claim 16, wherein the electrode layer is functioned as a floating gate, the ion supplying layer is functioned as a control gate.

\* \* \* \* \*